United States Patent [19]

Gronroos

[11] Patent Number: 5,350,956
[45] Date of Patent: Sep. 27, 1994

[54] DEVIATION LIMITING TRANSMISSION CIRCUIT

[75] Inventor: Mika J. Gronroos, Piispanristi, Finland

[73] Assignee: Nokia Mobile Phones Ltd., Finland

[21] Appl. No.: 979,292

[22] Filed: Nov. 20, 1992

[30] Foreign Application Priority Data

Nov. 29, 1991 [FI] Finland .................................. 915661

[51] Int. Cl.$^5$ .......................... H03K 3/01; H01P 1/22
[52] U.S. Cl. .................................. 307/556; 307/264; 307/540; 307/542; 307/553; 307/493; 307/520; 328/149; 328/169; 328/175

[58] Field of Search ............... 307/264, 540, 542, 556, 307/553, 493; 328/169, 175, 149

[56] References Cited

U.S. PATENT DOCUMENTS 4,498,055  2/1985  Dolby .................................... 333/14

Primary Examiner—Margaret Rose Wambach
Attorney, Agent, or Firm—Perman & Green

[57] ABSTRACT

A deviation limiting transmission circuit comprising a soft clipper (13) which performs measurements at two nodes. The soft clipper (13) limits both its own output signal and the output signal of a low-pass/band-stop filter (8) to selected maximum values thus preventing prolonged deviation overshoots.

7 Claims, 2 Drawing Sheets

DEVIATION LIMITING TRANSMISSION CIRCUIT

The invention relates to a deviation limiting transmission circuit preferably but not exclusively for use in a cellular radio telephone.

BACKGROUND OF THE INVENTION

FIG. 1 shows a simplified block diagram of the low frequency part of the transmission path for a speech signal in a radiotelephone according to prior art. The transmission path consists of a microphone 1, a microphone amplifier 2, a band-pass filter 3, a compressor 4, a pre-emphasis amplifier 5, a soft clipper 6, a hard clipper 7, a low-pass/band-stop filter 8, and an adder 9.

The microphone 1 transforms an acoustic sound signal into an electrical signal. The microphone amplifier 2 amplifies the low level sound signal. The band-pass filter 3 limits the bandwidth of the transmitting signal. The pass-band of the filter 3 is from about 0,3 kHz to 3 kHz.

The compressor 4 compresses the dynamics of the transmitting signal with a compression ratio of 2:1. When the signal has a certain level the gain of the compressor 4 is 0 dB. This level is called the ineffective level. If the level of the input signal is $+x$ dB compared with the ineffective level, then the level of the output signal is $+x/2$ dB. If the level of the input signal is $-x$ dB compared with the ineffective level, then the level of the output signal is $-x/2$ dB. The gain of the compressor 4 settles slowly. The rate of change of the gain is characterized by the strike time and the return time. The pre-emphasis amplifier 5 emphasizes frequency components at the higher end of the frequency band more than the frequency components at the lower end of the transmitting frequency band. The pre-emphasis is $+6$ dB/octave.

The soft clipper 6 and the hard clipper 7 limit the measured value normally the peak to peak value of the amplitude of the transmitting signal, so that the deviation on the radio path will be smaller than the limit value required by the radio telephone system in question. In the prior art device shown in FIG. 1 the the soft clipper measures only its own output signal.

The gain of the soft clipper 6 is a constant G (e.g. 0 dB), when the measured peak to peak value of the input signal is lower than a selected VINpp, max. When the measured peak to peak value of the input signal exceeds the value VINpp, max the gain of the soft clipper 6 decreases so that the measured peak to peak value of the output signal is kept at a constant value G * VINpp, max regardless of the input signal. The gain of the soft clipper 6 will settle slowly. The rate of change of the gain is characterized by the stroke time and the return time.

In order to prevent transient deviation overshots the soft clipper 6 is followed by a hard clipper 7. When the instantaneous value VIN of the signal at the hard clipper 7 input is lower than VIPmax and higher than VINmax (VIPmax = −VINmax), then the value of the output signal is higher than VIPmax, then the value of the output signal is the gain G of the hard clipper 7 multiplied by VIPmax (G * VIPmax). When the instantaneous value of the signal is lower than VINmax, then the value of the output signal is the gain G of the hard clipper 7 multiplied by VINmax (G * VINmax).

The low-pass/band-stop filter 8 limits the bandwidth of the transmitting signal (attenuates any generated harmonic frequency components) and attenuates noise coming from the speech path to the control signal bandwidth. The adder 9 adds the speech signal, the data signal DATA and the control signal SVS. The sum signal MOD is the signal modulating the modulator.

FIG. 2 shows an embodiment of the soft clipper 6 according to prior art. The shown embodiment is very well suited to be integrated in CMOS technology. The soft clipper 6 consists of a digitally controlled controllable amplifier 10, a window comparator 11 and of control logic 12.

The input signal CTRL has a level corresponding to the measured peak to peak value of the signal. The input signal IN is the input signal to the soft clipper 6 and the output signal OUT is the output signal of the soft clipper 6. The signal to be measured in the block diagram of FIG. 1 is the output signal of the soft clipper 6. The DC references REFP and REFN determine the maximum value of the measured peak to peak value of the output signal.

The window comparator 11 compares whether the monitored signal CTRL is within the references or outside them. The logic 12 reads the comparison result at the rising or falling edge of the clock signal CLK.

The logic 12 contains a control word of L bits, of which the N highest bits control the controllable amplifier 10. The core of the logic 12 comprises a counter of L bits. In an alternative embodiment the counter is replaced by a simple arithmetic unit counting in serial mode. The higher the value of the word formed by the N most significant bits the lower the gain of the controllable amplifier 10.

According to the value of the comparison result from the comparator 11, either a constant A (Attack) is added to the control word of L bits, or a constant D (Decay) is subtracted from it. Counting overflow is prevented; the minimum value of the control word is 0 and its maximum value is Lmax ($2^N-1$). The constant A is large compared with the constant D.

When the comparison value of the comparator 11 is outside its limits the constant A is added to the control word of L bits. The strike time of the soft clipper 6 is determined by the constant A. When the comparison value of the comparator 11 is within its limits the constant D is subtracted from the control word of L bits. The return time of the soft clipper 6 is determined by the constant D.

If the input signal level to soft clipper 6 increases suddenly, the soft clipper slowly starts to limit its output signal or the input signal level to hard clipper 7. The hard clipper 7 cuts off the signal peaks and thereby forms harmonic components. Harmonic components also exist in a continuous state, if the signal is cut off already before the soft clipper 6.

The low-pass/band-stop filter 8 after the hard clipper 7 typically has a considerable delay distortion. A compensation of the delay distortion with a delay equalizer would complicate the transmission path and would increase the noise, so in the design of this filter 8 no attention is paid to the phase response but only to the amplitude response.

Due to the delay distortion of the low-pass/band-stop filter 8 the signal contains harmonic components and in the worst case it resembles a square wave and will be distorted. The measured peak to peak value of the output signal does not equal the gain of the filter 8 multiplied by the measured peak to peak value of the input signal, but is C multiplied by the gain of the filter 8 multiplied by the measured peak to peak value of the input signal, where C is a function of the frequency and typically considerably greater than 1, especially at frequencies in the lower end of the speech band, e.g. 1,4.

Generally the transient deviation overshots do not pose any problems, but prolonged overshots may do. The problems most easily detected are the interruptions of calls.

SUMMARY OF THE INVENTION

According to the present invention there is provided a deviation limiting transmission circuit comprising a soft clipper coupled to a filter such that a signal output from the soft clipper is transmitted to the input of the filter which in time produces an output signal characterized by the soft clipper being capable of measuring the magnitude of both the signal output from the soft clipper and the signal output from the filter and capable of substantially limiting the magnitude of both of the measured signals to less than a predetermined maximum value.

An advantage of the present invention is the provision of deviation limitation which prevents prolonged deviation overshots in a speech signal and which is able to limit the deviation better and in a more controlled way than was previously available.

BRIEF DESCRIPTION OF THE DRAWINGS

An embodiment of the invention is now described in more detail, by way of example, with reference to the accompanying drawings, in which:

FIGS. 1 and 2 were described above.

DETAILED DESCRIPTION OF THE INVENTION

Figure 1:
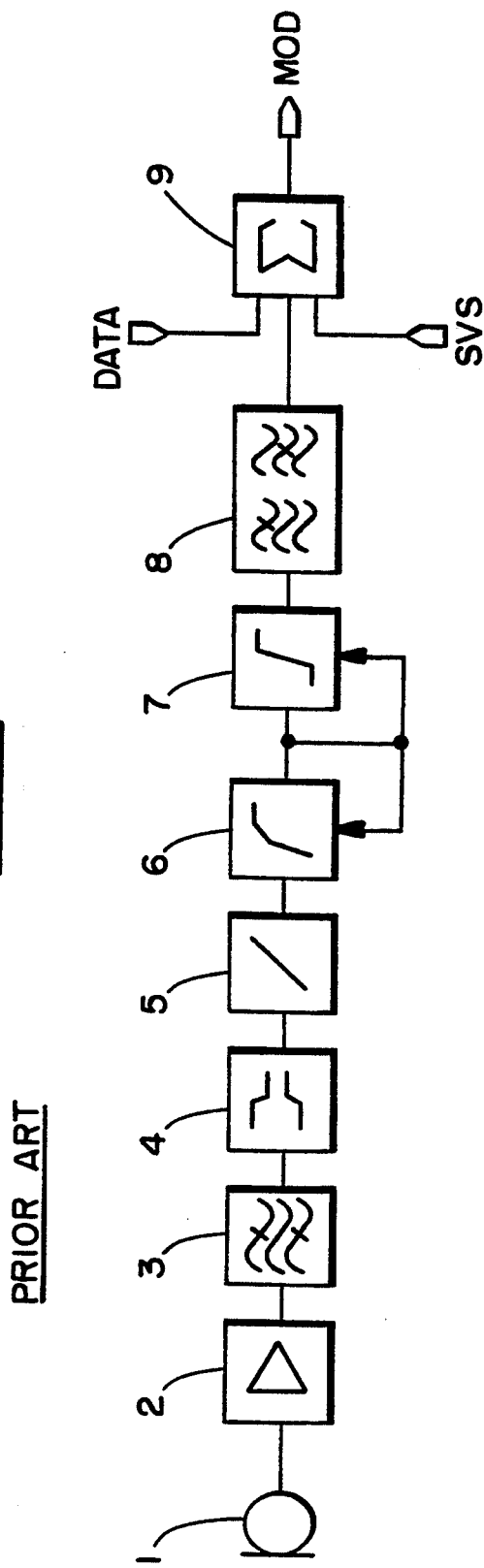
FIG. 1 shows a simplified block diagram of the low frequency part of the transmission path for the speech signal in a radio telephone in accordance with the prior art.
Figure 3:
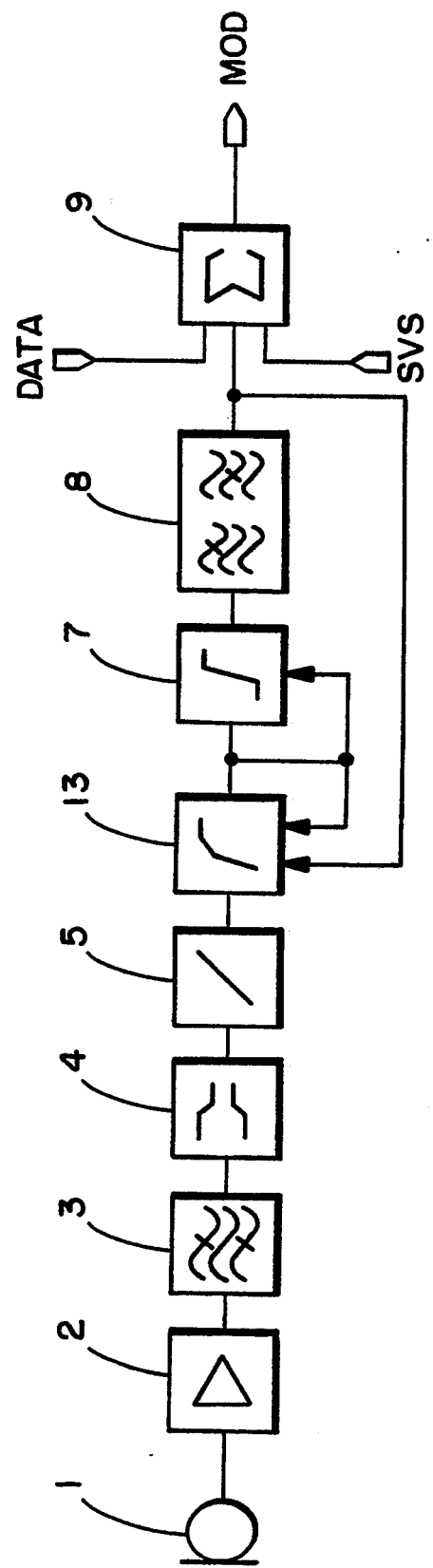
FIG. 3 shows a simplified block diagram of the low frequency part of the transmission path for a speech signal in accordance with the invention.
Figure 2:
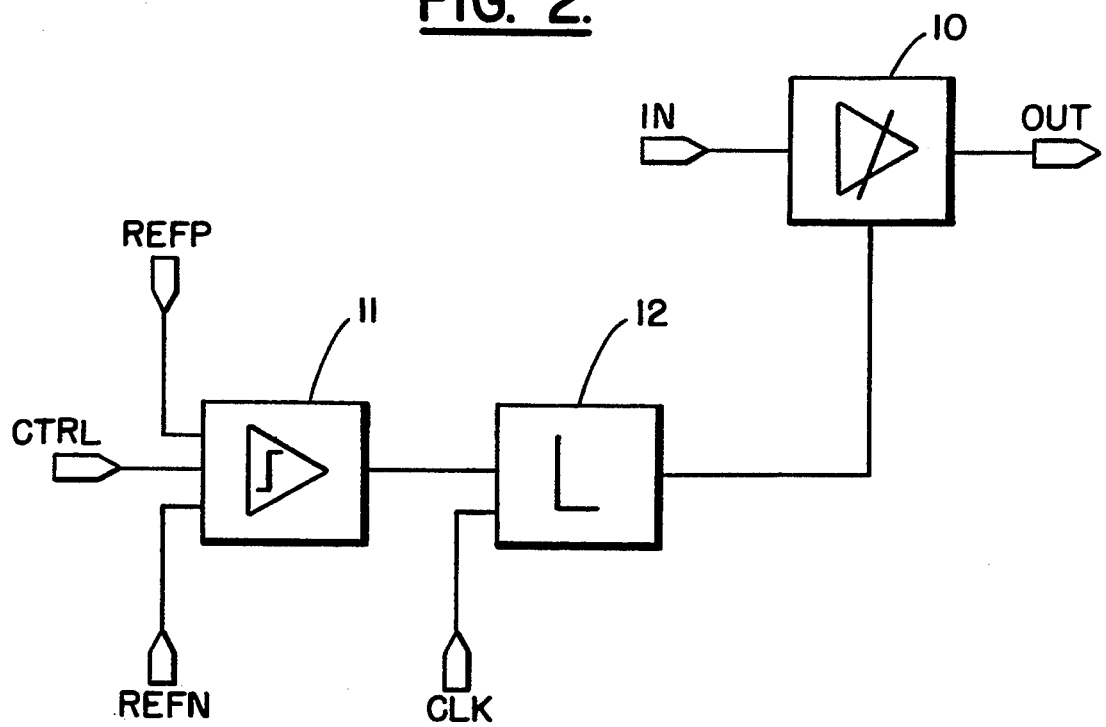
FIG. 2 shows a way to realize a soft clipper in accordance with the prior art.

FIG. 3 shows a simplified block diagram of the low frequency part of the transmission path for the speech signal in a radio telephone in accordance with the invention. The soft clipper 13 measures both its own output signal and the output signal from the low-pass/band-stop filter 8 after the hard clipper 7. In a continuous state the soft clipper 13 limits the signal level in said nodes so that the maximum of the measured peak to peak value in the output of the soft clipper 13 is the selected value Vmax1 and that the maximum of the measured peak to peak value at the output of the low-pass/band-stop filter 8 is the selected value Vmax2.

Figure 4:
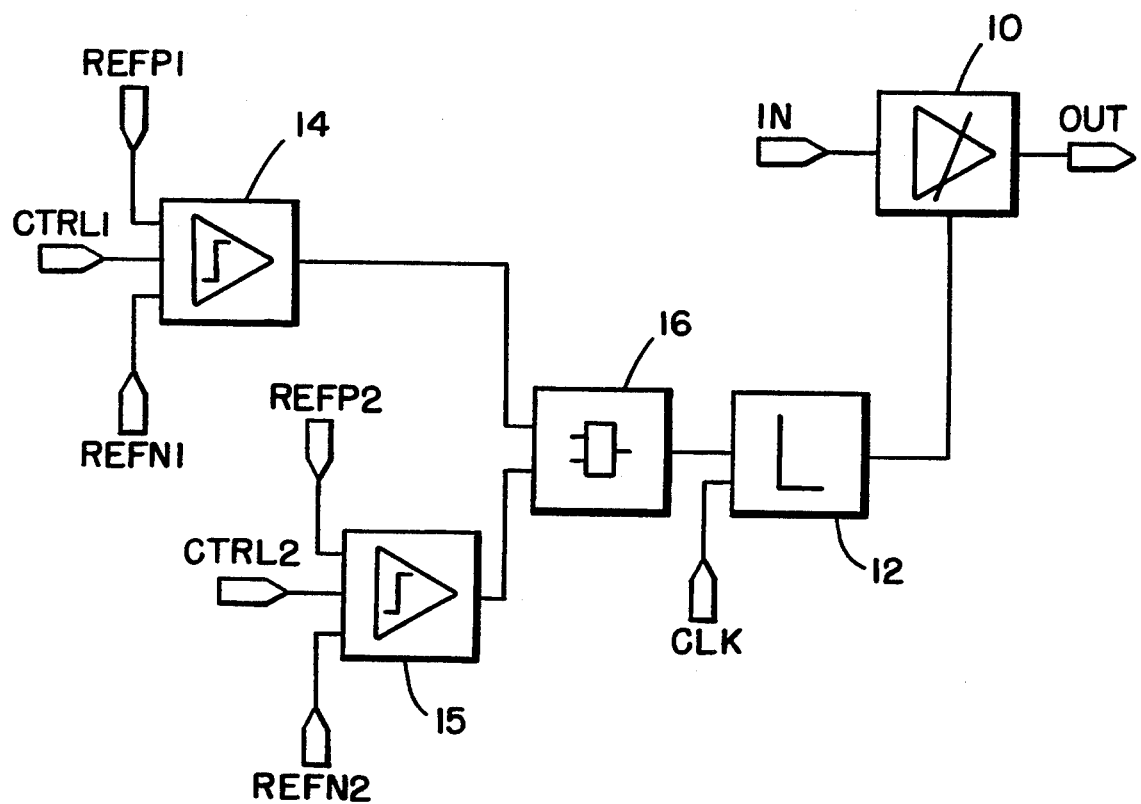
FIG. 4 shows a way to realize a soft clipper in accordance with the invention.

FIG. 4 shows a soft clipper in accordance with the invention which measures two signals. The embodiment includes two window comparators 14 and 15. The comparator 14 compares the value of the measured signal CTRL1 with the references REFP1 and REFN1, whereby REFP1=−REFN1, and the other comparator 15 compares the value of the measured signal CTRL2 with the references REFP2 and REFN2, whereby REFP2=−REFN2. The comparison results of the comparators 14 and 15 are combined with an OR device 16. The logic 12 and the controllable amplifier 10 operate in the same way as in the embodiment of the soft clipper 6 of prior art, which measures one signal.

When the signal CTRL1, and correspondingly CTRL2, is within the window determined by the references REFP1 and REFN1, and respectively REFP2 and REFN2, then the value of the output of comparator 14, and respectively the output of the comparator 15, is a logical 0, otherwise a logical 1. When the outputs of both comparators 14 and 15 are logical 0, then the output value of the OR device 16 is a logical 0, which means that the signals are within the references; otherwise the output value of the OR device 16 is a logical 1, which means that the signal values exceed the references.

It is possible to use one window comparator instead of the two window comparators 14 and 15, whereby the two necessary comparisons must be performed alternately, for example so that one comparison is made during one half wave of the clock signal CLK and the other comparison during the second half wave.

Due to the invention the maximum deviation overshots are limited to transient overshots. The maximum deviation is the maximum of the continuous state when the signal is not cut off before the soft clipper. Prolonged deviation overshots are prevented.

I claim:

1. A deviation limiting transmission circuit comprising a soft clipper coupled to a filter such that a signal output from the soft clipper is transmitted to the input of the filter which in time produces an output signal characterized by the soft clipper being capable of measuring the magnitude of both the signal output from the soft clipper and the signal output from the filter and capable of substantially limiting the magnitude of both of the measured signals to less than a predetermined maximum value.

2. A circuit as claimed in claim 1, wherein the predetermined maximum value of the signal output from the soft clipper and the signal output from the filter are different.

3. A circuit as claimed in claim 1, wherein the filter is a lowpass/bandstop filter.

4. A circuit as claimed in claim 1, wherein the soft clipper measures the peak to peak magnitude of said signals.

5. A circuit as claimed in claim 1, wherein the soft clipper comprises a first and a second comparator, the first comparator measuring the signal output from the soft clipper and the second comparator measuring the signal output from the filter.

6. A circuit as claimed in claim 1, wherein the soft clipper comprises a single comparator which measures a first signal during the first half of a clock signal and a second signal during the second half of a clock signal.

7. A circuit as claimed in claim 6, wherein the first signal is the signal from the soft clipper and the second signal is the signal output from the filter.

* * * * *